(12) United States Patent
Cohen et al.

(10) Patent No.: US 8,264,388 B1
(45) Date of Patent: Sep. 11, 2012

(54) FREQUENCY INTEGRATOR WITH DIGITAL PHASE ERROR MESSAGE FOR PHASE-LOCKED LOOP APPLICATIONS

(75) Inventors: Hanan Cohen, San Diego, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 233 days.

(21) Appl. No.: 12/899,500

(22) Filed: Oct. 6, 2010

Related U.S. Application Data

(63) Continuation-in-part of application No. 12/841,131, filed on Jul. 21, 2010, now Pat. No. 8,106,808.

(51) Int. Cl.
*H03M 1/48* (2006.01)

(52) U.S. Cl. ........ 341/117; 341/111; 327/106; 327/147; 327/292; 327/299; 360/51; 331/10

(58) Field of Classification Search .......... 341/111–117; 327/106.107, 147, 292, 299, 156, 157, 115, 327/117; 360/51; 331/10, 11, 18, 107, 155, 331/158; 371/27, 21, 25, 26; 455/76
See application file for complete search history.

(56) References Cited

U.S. PATENT DOCUMENTS

| | | | |
|---|---|---|---|
| 6,099,161 A * | 8/2000 | Furlan | 714/25 |
| 6,249,155 B1 * | 6/2001 | Hartman et al. | 327/106 |
| 7,356,111 B1 * | 4/2008 | Dean | 375/376 |
| 7,986,195 B2 * | 7/2011 | Ramirez | 332/119 |
| 8,094,754 B2 * | 1/2012 | Eker et al. | 375/327 |
| 8,106,808 B1 * | 1/2012 | Cohen et al. | 341/166 |
| 8,111,785 B2 * | 2/2012 | Do et al. | 375/327 |

OTHER PUBLICATIONS

Chun-Ming Hsu et al., A Low-Noise Wide-BW 3.6-GHz Digital ΔΣ Fractional-N Frequency Synthesizer With a Noise-Shaping Time-to-Digital Converter and Quantization Noise Cancell*.

* cited by examiner

*Primary Examiner* — Lam T Mai
(74) *Attorney, Agent, or Firm* — Law Office of Gerald Maliszewski; Gerald Maliszewski

(57) ABSTRACT

A digital phase-locked loop (DPLL), a supporting digital frequency integrator, and a method are provided for deriving a digital phase error signal in a DPLL. A digital frequency integrator periodically accepts a digital tdcOUT message from a Time-to-Digital Converter (TDC) representing a measured ratio of a reference clock (Tref) period to a synthesizer clock (Tdco) period. Also accepted is a digital message selecting a first ratio (Nf). In response, a digital phase error (pherr) message is periodically supplied that is proportional to an error in phase between the reference clock and the (synthesizer clock*Nf).

14 Claims, 8 Drawing Sheets

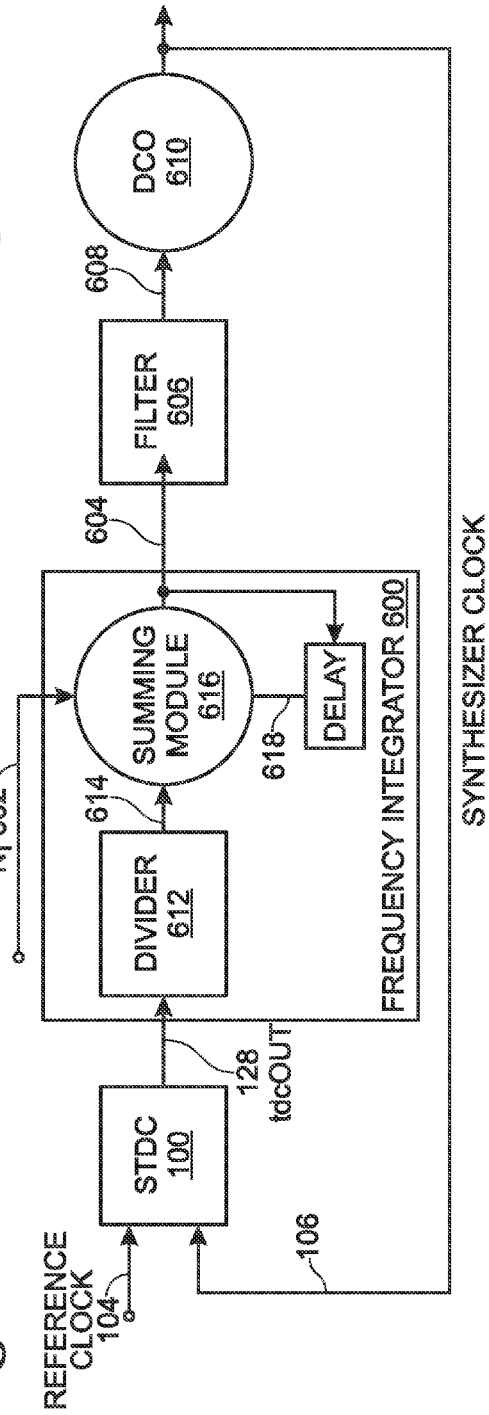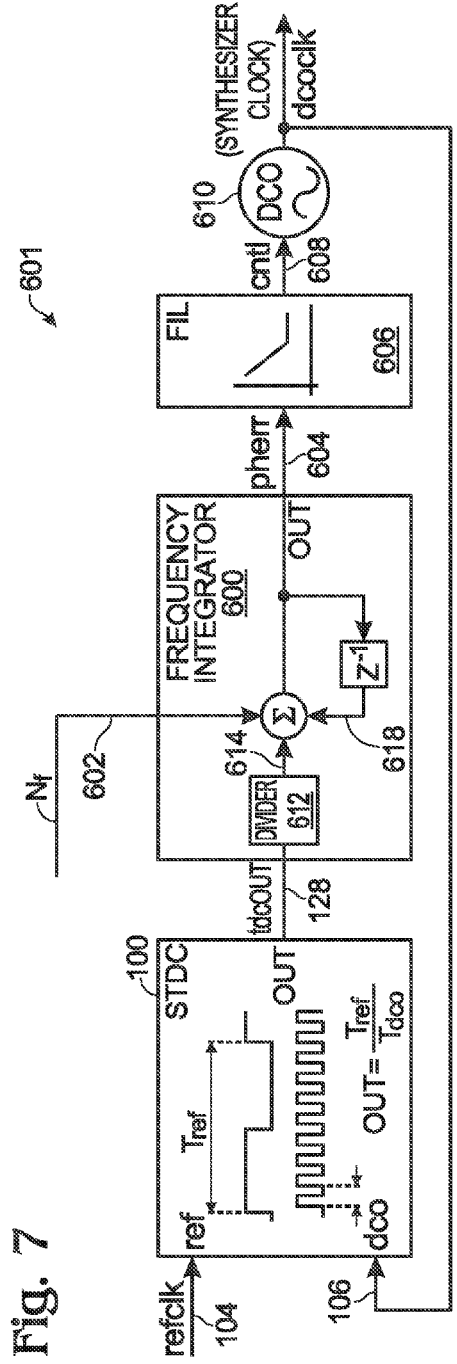
Fig. 6
Fig. 7

FREQUENCY INTEGRATOR WITH DIGITAL PHASE ERROR MESSAGE FOR PHASE-LOCKED LOOP APPLICATIONS

RELATED APPLICATIONS

This application is a Continuation-in-Part of a patent application entitled, SUCCESSIVE TIME-TO-DIGITAL CONVERTER FOR A DIGITAL PHASE-LOCKED LOOP, invented by Hanan Cohen et al, Ser. No. 12/841,131, filed Jul. 21, 2010 now U.S. Pat. No. 8,106,808, which is incorporated herein by reference.

BACKGROUND OF THE INVENTION

1. Field of the Invention

This invention generally relates to digital communications and, more particularly, to a system and method for generating a digital phase error message for phase-locked loop (PLL) applications.

2. Description of the Related Art

Digital PLLs (DPLLs) are an area of active research and development. A DPLL performs the loop filtering function in the digital domain with synthesized logic. DPLLs provide several advantages over the analog PLLs, including easier and faster implementation, and better controllability of the PLL parameters. Also, the integrated circuit (IC) die area devoted to the circuitry and power consumption can be greatly reduced, especially in advanced fabrication processes. Therefore, there is a growing interest in DPLLs for high performance applications.

FIG. 10 is a schematic block diagram of a fractional-N digital PLL (prior art). PLL clock synthesizers are ubiquitous in communication systems. Despite the popularity of the integer divider phase lock loop (PLL), fractional-N PLLs provide additional flexibility with the ratio of output clock frequency to reference clock frequency being a fraction rather than an integer. Conventional Fractional-N PLLs require a modulus divider, such that the average divide ratio of the feedback clock is a fraction, by modulating the divide ratio of a modulus divider. This divider modulation produces in-band modulation noise and requires PLL bandwidth to be low to filter out the in-band noise.

In a PLL based frequency synthesizer, the voltage controlled oscillator (VCO) clock is constantly compared with a reference clock. This comparison generates an error signal that is filtered and provided to the VCO, to correct the VCO frequency. In a charge pump PLL (CPPLL), a combination of phase/frequency detector (PFD) and charge pump perform phase error detection, and output an analog error signal. In DPLL, there is a need to convert this analog error signal to a digital error signal. One way of converting an analog signal to a digital signal is to utilize an analog-to-digital converter (A/D), but this approach requires additional power consumption and IC die area. A more practical approach would be to use a time-to-digital converter (TDC) to directly convert the phase offset to a digital error signal. A TDC can be used to digitize the duration of time between two events, usually represented by the edges of a signal. As described in more detail below, a TDC can be enabled with a delay line and sampling flip flops.

A key implementation challenge with the use of a TDC is the achievement a fine resolution error signal, in order to minimize the quantization noise effect on the PLL closed loop performance. However, a very fine resolution TDC usually has high power consumption, making it unattractive compared to conventional charge pump architecture. Therefore, a major challenge associated with a TDC is the tradeoff between resolution and power consumption. For example, a 155 Megahertz (MHz) reference clock and 5 picoseconds (ps) of resolution require more than $2^{10}$ delay elements/samplers.

It would be advantageous if a low-power TDC architecture could be used in DPLLs. To that end, the parent application entitled, SUCCESSIVE TIME-TO-DIGITAL CONVERTER FOR A DIGITAL PHASE-LOCKED LOOP, invented by Hanan Cohen et al, Ser. No. 12/841,131, filed Jul. 21, 2010, provides a TDC to replace a conventional PFD/charge pump in an analog PLL system. The TDC compares a reference clock to a frequency synthesizer feedback clock, and generates a digital word that represents the phase offset between the two.

It would be advantageous if the above-mentioned digital word, representing the phase offset between reference and PLL synthesizer frequencies, could be converted to a digital phase error for use with a digital synthesizer frequency source.

SUMMARY OF THE INVENTION

Disclosed herein are a system and method for converting a digital word, representing the phase offset between reference and phase-locked loop (PLL) synthesizer clocks, to a digital phase error word. A Successive Time to Digital Converter (STDC) processes the reference clock and frequency synthesizer clock, and generates a digital word representing the ratio of the two clock cycles, from which a digital representation of phase offset can be derived. The STDC is able to achieve comparable resolution to a conventional TDC with almost an order of magnitude fewer delay element/samplers. Furthermore, the STDC allows dynamic power management, which significantly reduces the power consumption. By improving the performance-to-power dissipation ratio of TDCs, the building of power efficient high performance digital PLLs is possible.

The combination of the digital phase error word and the STDC permit a divider-less fractional-N digital PLL to be built, requiring no divider modulation. By eliminating the noise associated with the sigma delta modulator, a low PLL bandwidth is not required for noise filtering. The high bandwidth supports wide bandwidth modulation and fast settling. While conventionally modulus PLLs create noise folding from high frequency to in-band, increasing the jitter of the output clock, the absence of modulation noise and nonlinearities associated with the claimed invention creates an output clock with lower phase noise and jitter.

Accordingly, a method is provided for deriving a digital phase error signal in a digital phase-locked loop (PLL). A digital frequency integrator periodically accepts a digital tdcOUT message from a Time-to-Digital Converter (TDC) representing a measured ratio of a reference clock (Tref) period to a synthesizer clock (Tdco) period. Also accepted is a digital message selecting a first ratio (Nf). In response, a digital phase error (pherr) message is periodically supplied that is proportional to an error in phase between the reference clock and the (synthesizer clock*Nf).

More explicitly, a digital frequency integrator divider accepts tdcOUT messages and the supplies divided tdcOUT (1/tdcOUT) messages. A summing module, having inputs to accept the divided tdcOUT messages, the first ratio Nf, and a previous pherr message (pherr[k−1]), adds pherr[k−1] to the divided tdcOUT message and subtracts Nf to supply a current period pherr message (pherr[k]). A delay, having an input to accept the current pherr message, supplies the previous pherr message in a subsequent time period.

Additional details of the above-described method, digital frequency integrator, and digital PLL are presented below.

BRIEF DESCRIPTION OF THE DRAWINGS

FIG. 6 is a schematic block diagram of a digital phase-locked loop (PLL).

FIG. 7 is an alternate depiction of the DPLL of FIG. 6, implemented in a divider-less fractional-N digital PLL (DFN-PLL) block diagram.

DETAILED DESCRIPTION

Figure 1:
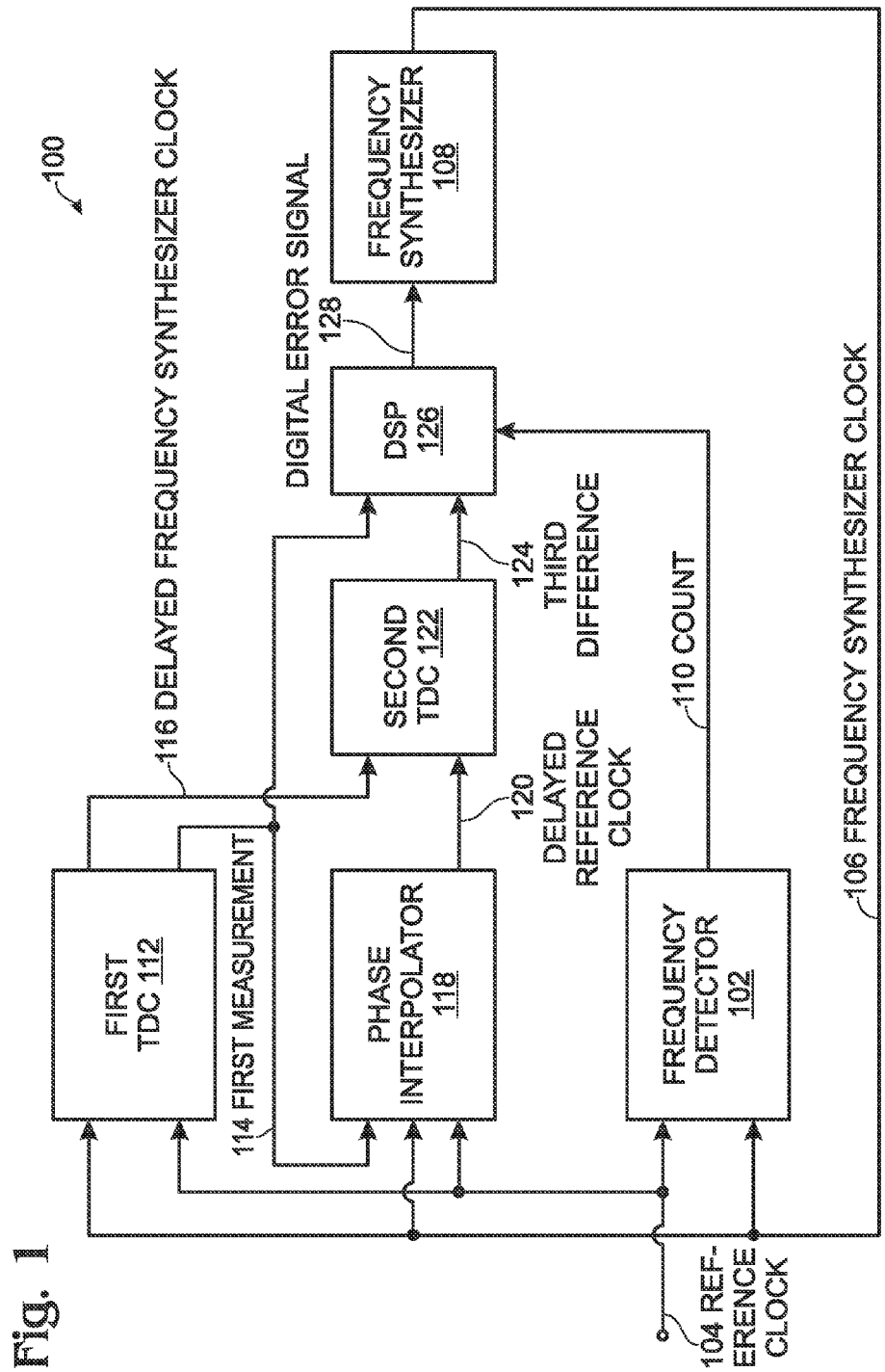
FIG. 1 is a schematic block diagram of a successive time-to-digital converter (STDC) and frequency synthesizer.

FIG. 1 is a schematic block diagram of a successive time-to-digital converter (STDC) and frequency synthesizer. The STDC 100 comprises a frequency detector 102 having an input on line 104 to accept a reference clock (REFCLK), and an input on line 106 to accept a frequency synthesizer clock (VCOCLK) from a frequency synthesizer 108. The frequency detector 102 has an output on line 110 to supply a count of the number of frequency synthesizer clock cycles per reference clock cycle (HSCNTROUT), also referred to as the count. A first TDC 112 has an input on line 104 to accept the reference clock, and an input on line 106 to accept the frequency synthesizer clock. The first TDC 112 measures a first difference between an edge of a reference clock period and a corresponding edge of a frequency synthesizer clock period, and provides the first difference measurement (CTDCOUT) at an output on line 114. The first TDC 112 also provides the frequency synthesizer clock delayed a full cycle (VCOCLK+ $2\pi$) on line 116.

A phase interpolator 118 has an input on line 104 to accept the reference clock, an input on line 106 to accept the frequency synthesizer clock, and an input on line 114 to accept the first difference measurement. The phase interpolator 118 supplies the reference clock on line 120 delayed to create a second difference (REFCLK+$\Phi_x$) between the edge of the delayed reference clock period and the corresponding edge of the frequency synthesizer clock period, where the second difference is less than the first difference.

A second TDC 122 has an input on line 120 to accept the delayed reference clock period, and input on line 116 to accept the delayed frequency synthesizer clock. The second TDC 122 measures a third difference (FTDCOUT) between the edge of the delayed reference clock period and the corresponding edge of the delayed frequency synthesizer clock period, and provides the third difference measurement as a time duration on line 124. A digital signal processor (DSP) 126 has an input on line 124 to accept the third difference measurement, an input on line 114 to accept the first difference measurement, and an input on line 110 to accept the count from the frequency detector. The DSP 126 has an output on line 128 to supply a digital error signal (tdcOUT).

Figure 2:
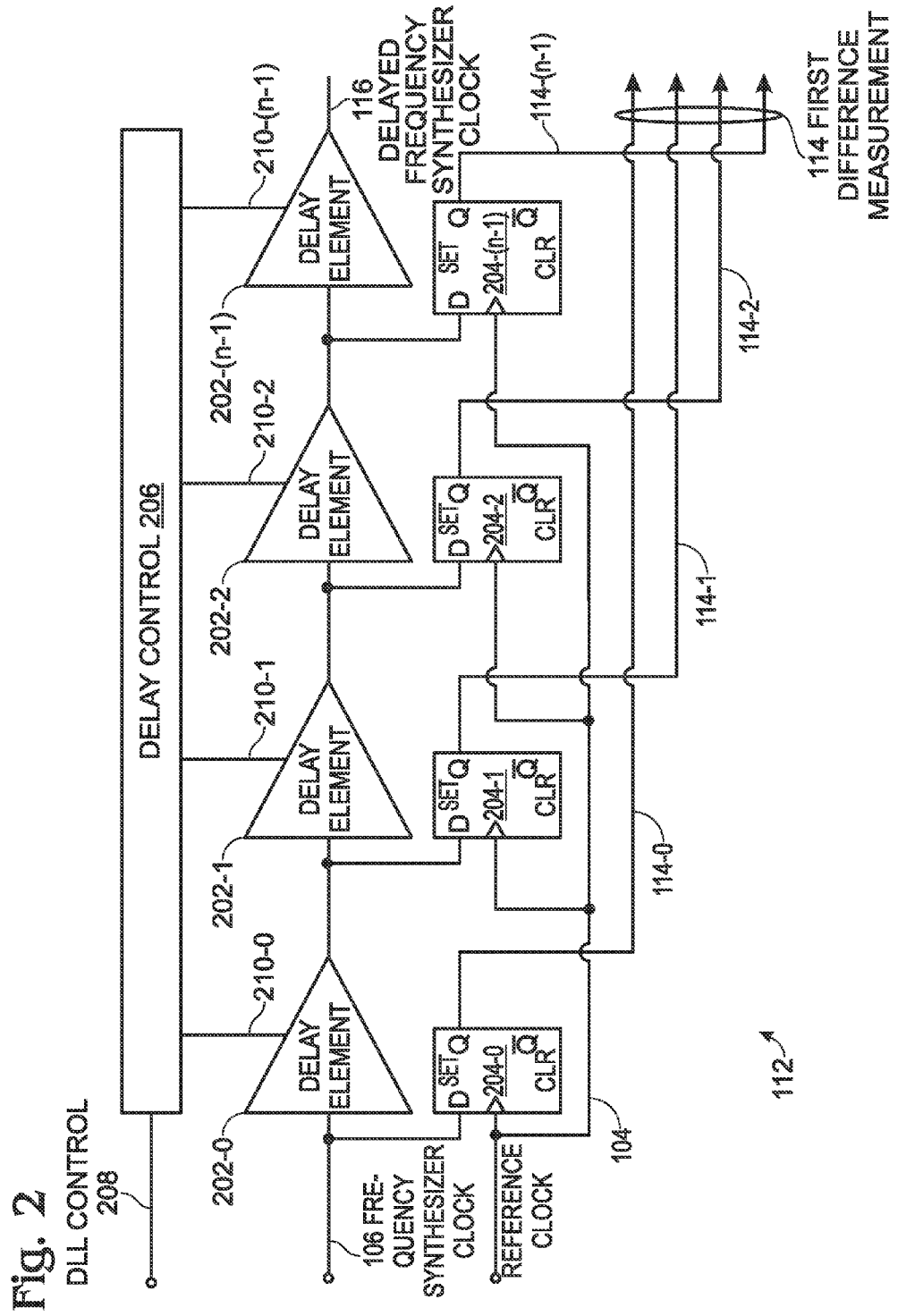
FIG. 2 is a schematic block diagram depicting a detailed example of the first TDC of FIG. 1.

FIG. 2 is a schematic block diagram depicting a detailed example of the first TDC of FIG. 1. In one aspect, the first TDC 112 supplies the first difference measurement as a digital word representing the relationship between the edge of the reference clock and a phase of the frequency synthesizer clock. As shown in this example, the first TDC 112 includes n serially connected delay circuits 202-0 through 202-($n-1$) accepting the frequency synthesizer clock on line 106, and supplying n frequency synthesizer clock phases on line 106 (no delay), 200-0, 200-1, and 200-($n-1$). In this example, n=4, but the TDC is not limited to any particular value. Also shown are n latches 204-0 through 204-($n-1$). Each latch 204 has a signal input connected to receive a corresponding frequency synthesizer clock phase. Each latch 204 also has a clock input connected to receive the reference clock on line 104, and an output on line 114 to supply a corresponding bit in an n-bit first difference measurement signal.

Also shown is a delay control element 206 accepting a DLL control signal on line 208 from the DSP (not shown in FIG. 1). The delay control element 206 is able to control the delay through delay elements 202 with signals on lines 210-0 through 210-($n-1$), in response to the DLL control signal. As used herein, delay coverage is the maximum period of time that a TDC can process. The time period beyond the delay coverage cannot be distinguished by the TDC. Typically, the delay coverage is the total delay of the delay chain. Resolution is the TDC step size as a time duration measurement, and dynamic range is the ratio of delay coverage to resolution. These variables may be set with the DLL control signal.

It should be noted that a number of TDC designs are known in the art, and that the first TDC of FIG. 1 can be enabled using designs other than the example depicted in FIG. 2.

Figure 3:
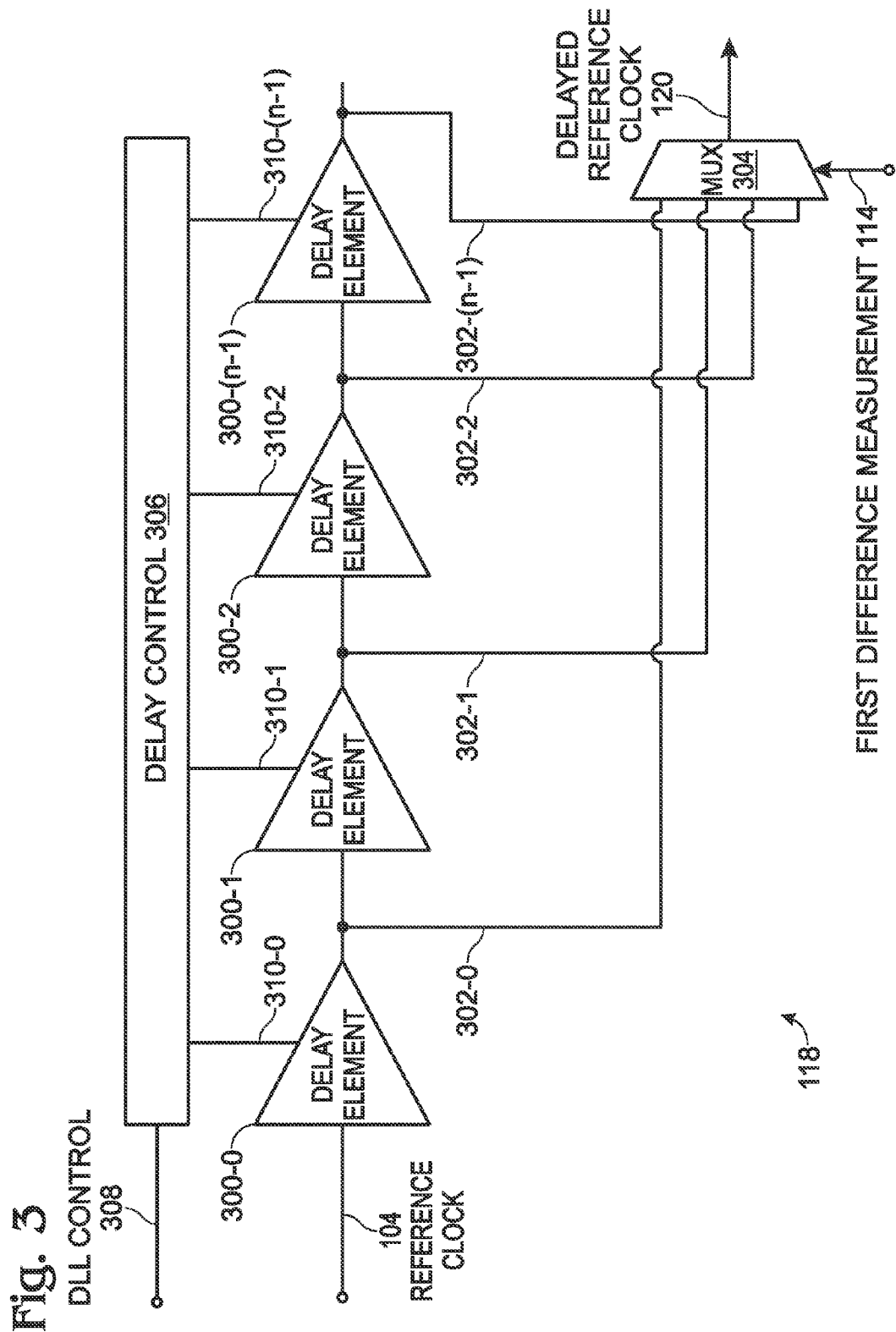
FIG. 3 is a schematic block diagram depicting a detailed example of the phase interpolator of FIG. 1.

FIG. 3 is a schematic block diagram depicting a detailed example of the phase interpolator of FIG. 1. As shown, n serially connected delay circuits 300-0 through 300-($n-1$) accept the reference clock on line 104, and supply n reference clock phases on 302-0, 302-1, 302-2, and 302-($n-1$). In this example n=4, but the phase interpolator is not limited to any particular value. A multiplexer (MUX) 304 has signal inputs on lines 302-0, 302-1, 302-2, and 302-($n-1$) to accept the n reference clock phases and a control input on line 114 to accept the first difference measurement.

Also shown is a delay control element 306 accepting a DLL control signal on line 308 from the DSP (not shown in FIG. 1). The delay control element 306 is able to control the delay through delay elements 300 with signals on lines 310-0 through 310-($n-1$), in response to the DLL control signal. It should be noted that a number of TDC designs are known in the art, and that the phase interpolator of FIG. 1 can be enabled using designs other than the example depicted in FIG. 3.

Figure 4:
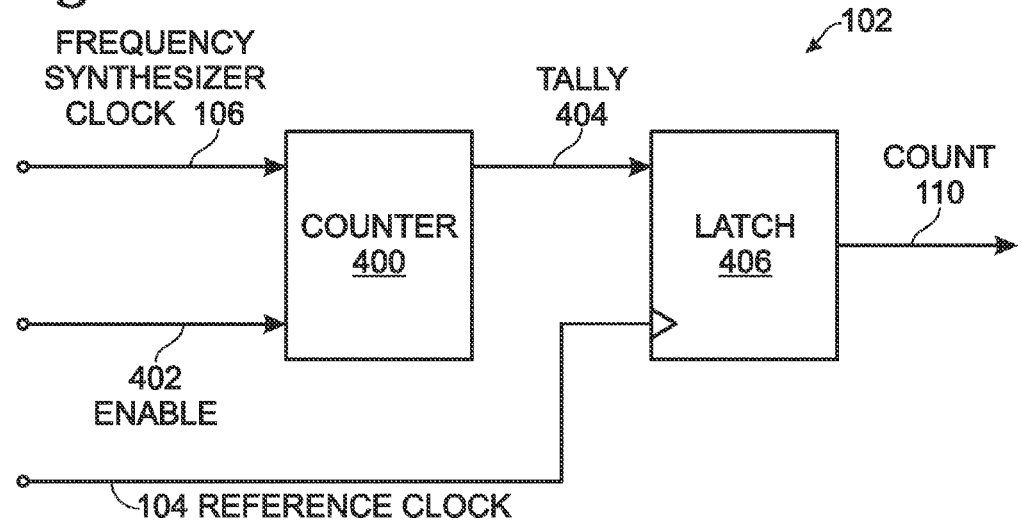
FIG. 4 is a schematic block diagram depicting an example of the frequency detector of FIG. 1 is greater detail.

FIG. 4 is a schematic block diagram depicting an example of the frequency detector of FIG. 1 is greater detail. In this example, the frequency detector 102 includes a counter 400 having an input to accept the frequency synthesizer clock on line 106, an input to accept an enable signal from the DSP on line 402, and an output to supply a tally (COUNTVAL) on line 404, triggered by the enable signal. A latch 406 has a signal input to accept the tally on line 404, and clock input connected to receive the reference clock on line 104, and an output to supply the count of the number of frequency synthesizer clock cycles per reference clock cycle on line 110. Other means of sampling the number of frequency synthesizer clock cycles per reference clock cycle are known in the art that would enable the frequency counter of FIG. 1.

Figure 5:
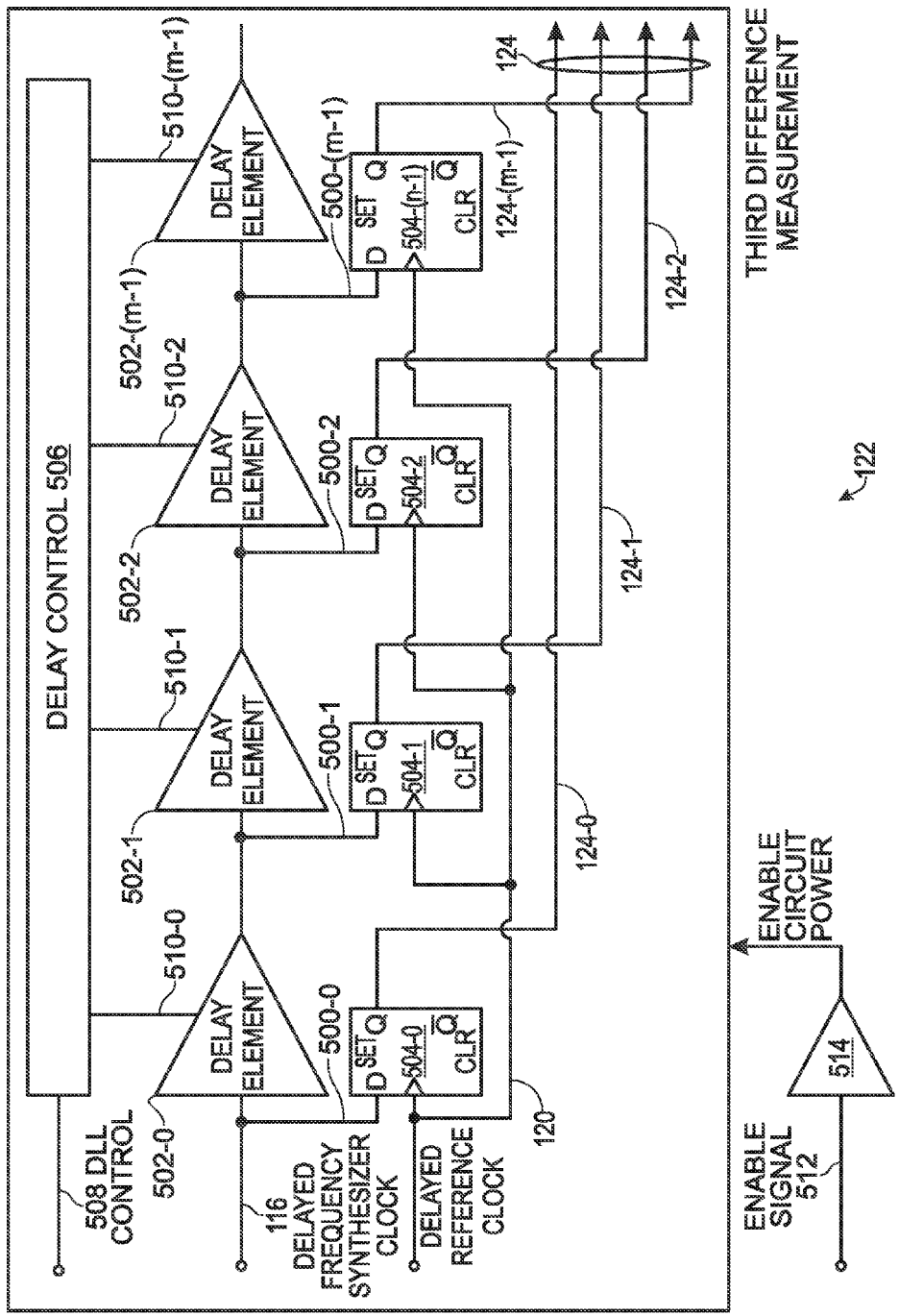
FIG. 5 is a schematic block diagram depicting a detailed example of the second TDC of FIG. 1.

FIG. 5 is a schematic block diagram depicting a detailed example of the second TDC of FIG. 1. In one aspect, the second TDC 122 supplies the third difference measurement as a digital word on line 124, representing the relationship between the edge of the delayed reference clock and a phase of the delayed frequency synthesizer clock. As shown in this example, the second TDC 122 includes m serially connected delay circuits 502-0 through 502-($m$−1) to accept the delayed frequency synthesizer clock on line 116, and supplying m phases of the delayed frequency synthesizer clock on line 116 (500-0), 500-1, 500-2, and 500-($m$−1). In this example, m=4, but the TDC is not limited to any particular value. Neither is there any particular relationship between the value of m and the value of n. Also shown are m latches 504-0 through 504-($m$−1). Each latch 504 has a signal input connected to receive a corresponding phase of the delayed frequency synthesizer clock. Each latch 504 also has a clock input connected to receive the delayed reference clock on line 120, and an output on line 124 to supply a corresponding bit in an m-bit third difference measurement signal.

Also shown is a delay control element 506 accepting a DLL control signal on line 508 from the DSP (not shown in FIG. 1). The delay control element 506 is able to control the delay through delay elements 502 with signals on lines 510-0 through 510-($m$−1), in response to the DLL control signal. It should be noted that a number of TDC designs are known in the art, and that the second TDC of FIG. 1 can be enabled using designs other than the example depicted in FIG. 5.

In another aspect, the second TDC 122 is selectively enabled in response to a signal from the DSP on line 512. As shown, device 514 supplies power to the second TDC 122 on line 516 in response to the enable signal on line 512.

FIG. 6 is a schematic block diagram of a digital phase-locked loop (PLL). The digital PLL (DPLL) 601 comprises a STDC 100 having an input on line 104 to accept a reference clock, an input on line 106 to accept a synthesizer clock from a frequency synthesizer, and an output on line 128 to periodically supply a digital tdcOUT message representing a measured ratio of the reference clock (Tref) period to the synthesizer clock (Tdco) period. Details of the STDC are presented above in the explanation of FIGS. 1 through 5.

A frequency integrator or digital frequency integrator 600 has a first input on line 128 to accept the tdcOUT messages, and a second input on line 602 to accept a digital message selecting a first ratio (Nf). The frequency integrator 600 has an output on line 604 to periodically supply a digital phase error (pherr) message proportional to an error in phase between reference clock and the (synthesizer clock*ND. In one aspect, the STDC 100 supplies the tdcOUT message at a rate equal to the reference clock frequency, and the frequency integrator 600 supplies the pherr message at a rate equal to the reference clock frequency. In one aspect (not shown), the frequency integrator is enabled as part of the STDC DSP.

A digital loop filter 606 has an input on line 604 to accept the pherr message and an output on line 608 to periodically supply a digital control message. A digitally controlled oscillator (DCO) 610 has an input on line 608 to accept the control messages and an output on line 106 to supply the synthesizer clock in response to the control messages.

The frequency integrator 600 calculates a period difference (err) value as follows:

$$err[k] = Tdiv + err[k-1] - Tref;$$

where Tdiv is the period of (synthesizer clock*Nf); and, where k is a time sequence value.

The frequency integrator 600 refines the calculation of the err value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

where out[k]=Tref/Tdco.

As a result, the frequency integrator supplies the pherr message as follows:

$$pherr[k] = err[k]/Tref;$$

$$pherr[k] = Nf/out[k] + pherr[k-1] - 1$$

$$pherr[k] = Nf(1/out[k]) + pherr[k-1]/Nf - Nf.$$

The frequency integrator 600 includes a divider 612 to accept the tdcOUT messages on line 128 and to supply divided tdcOUT (1/tdcOUT) messages on line 614. A summing module 616 has inputs to accept the divided tdcOUT messages on line 614, the first ratio Nf on line 602, and a previous pherr message (pherr[k−1]) on line 618. The summing module 616 adds pherr[k−1] to the divided tdcOUT message and subtracts Nf, to supply a current period pherr message (pherr[k]) on line 604. A delay 620 has an input on line 604 to accept the current pherr message and an output to supply the previous pherr message on line 618 in a subsequent time period.

Functional Description

Definition of Terms $T_{ref}$: Period of Refclk;
$Tri_{dco}$: Period of DCO output, dcoclk;
$N_F$: the desired dcoclk frequency divided by refclk frequency;
PLL: Phase Lock Loop;
$F_{dco}$: Frequency of DCO;
$F_{ref}$: Frequency of refclk;
Divclk: a fictitious clock with instantaneous period equal to exactly $T_{dco} \times N_F$. This is equivalent to an output of a fractional divider. This clock is defined to aid derivation (see FIG. 8).

FIG. 7 is an alternate depiction of the DPLL of FIG. 6, implemented in a divider-less fractional-N digital PLL (DFN-PLL) block diagram. A reference clock, refclk, serves as an input to the device. dcoclk, a clock with a frequency $N_F$ times the reference serves as the output, where $N_F$ can be an integer or fraction. The STDC 100 measures the ratio of $T_{ref}$ to $T_{doc}$. The output is in the form of a digital word.

Figure 8:
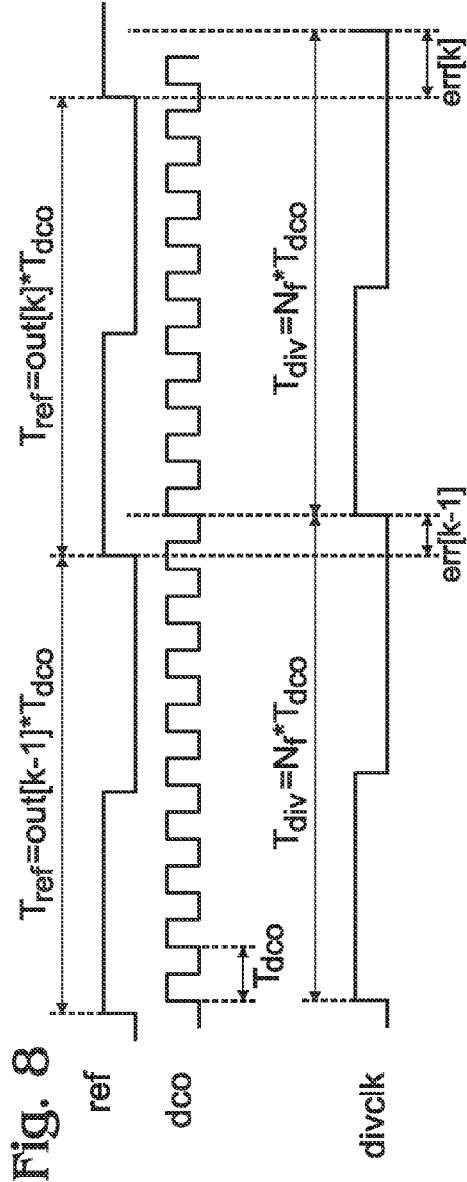
FIG. 8 is a timing diagram of frequency integrator signals in support of the systems depicted in FIGS. 6 and 7.

FIG. 8 is a timing diagram of frequency integrator signals in support of the systems depicted in FIGS. 6 and 7. The frequency integrator 600 derives the phase offset between the refclk and a fictitious divclk with frequency $f_{dco}/N_F$.

$$err[k] = T_{div} + err[k-1] - T_{ref}$$

$$\frac{err[k]}{Tref} = \frac{T_{div}}{Tref} + \frac{err[k-1]}{Tref} - 1$$

-continued $$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

Define err[k] as the ratio of pherr[k] and $T_{ref}$.

$$pherr[k] = \frac{err[k]}{Tref}$$

Then, $$pherr[k] = \frac{Nf}{out[k]} + pherr[k-1] - 1$$

The digital filter (FIL) 606 of FIG. 7 provides the necessary filtering (frequently implemented as a lead-lag filter with low pass filter), to adjust the frequency of dcoclk via the DCO 610. An optional delta-sigma modulation (not shown) can be included to spread quantization noise to higher frequency. The digital control oscillator (DCO) 610 generates an oscillator frequency according to the digital control word at the input.

In operation, the phase difference of dcoclk and refclk is constantly monitored and represented as the signal pherr. A positive phase error results in an increase in the DCO frequency. A negative phase error results in a decrease in the DCO frequency. The negative feedback loop converges such that when stable, refclk and dcoclk achieve phase locking and the frequency of dcoclk is, on average, exactly the same as refclk×$N_F$. Lock detection can be implemented by monitoring the pherr output. Lock is declared when pherr average value is close to 0. Although not shown, both the DCO and filter can be implemented with analog circuits as well with the same benefits.

Figure 9:
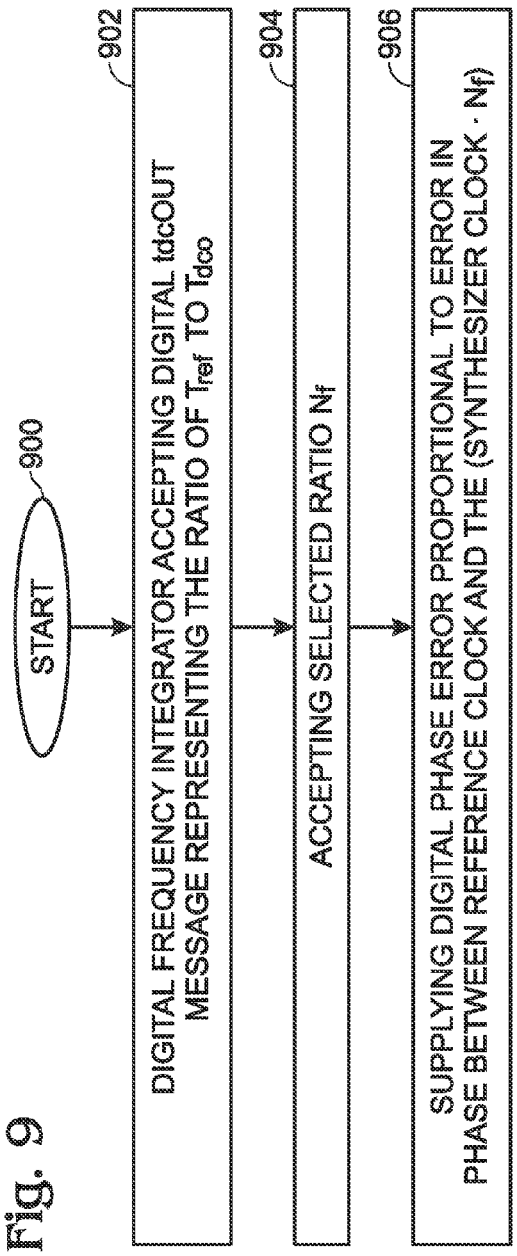
FIG. 9 is a flowchart illustrating a method for deriving a digital phase error signal in a digital PLL.
Figure 10:
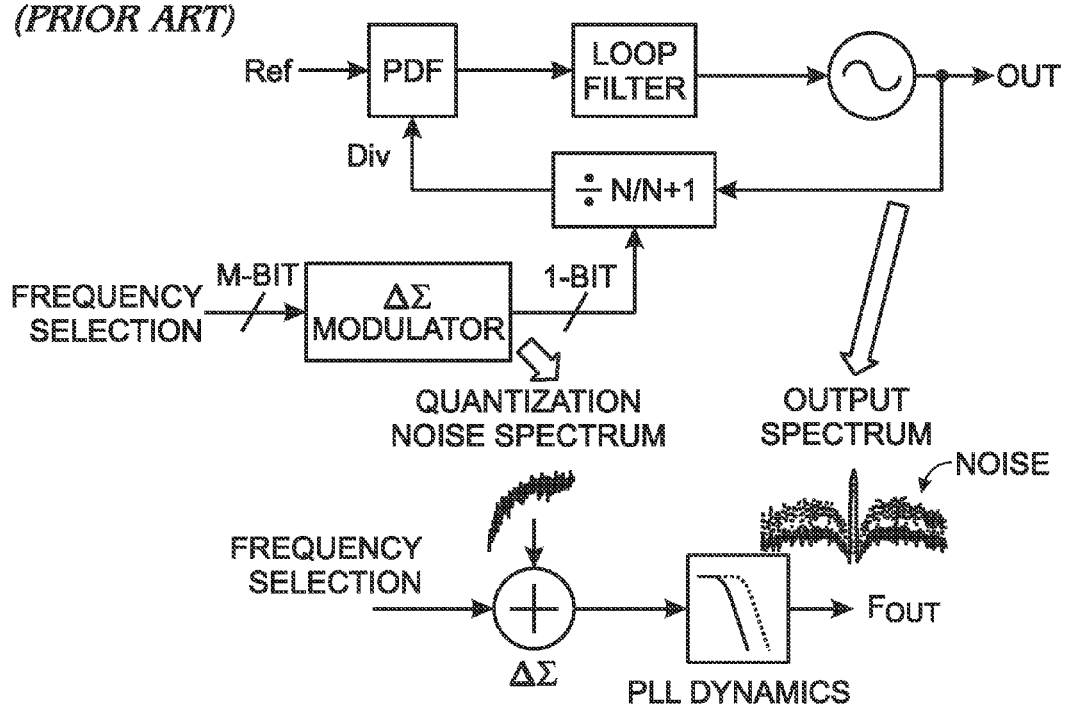
FIG. 10 is a schematic block diagram of a fractional-N digital PLL (prior art).

FIG. 9 is a flowchart illustrating a method for deriving a digital phase error signal in a digital PLL. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 900.

In Step 902 a digital frequency integrator periodically accepts a digital tdcOUT message from a Time-to-Digital Converter (TDC) representing a measured ratio of a reference clock (Tref) period to a synthesizer clock (Tdco) period. Step 904 accepts a digital message selecting a first ratio (Nf). Step 906 periodically supplies a digital phase error (pherr) message proportional to an error in phase between the reference clock and the (synthesizer clock*Nf).

A system and method have been provided for using a STDC and a digital frequency integrator to create a digital phase error word representing the ratio between a phase-locked loop PLL frequency synthesizer signal and a reference clock. Explicit examples of circuit typologies have been given to illustrate the invention, but the invention is not necessarily limited to just these examples. Other variations and embodiments of the invention will occur to those skilled in the art.

We claim:

1. A digital frequency integrator comprising:
   a first input to periodically accept a digital tdcOUT message from a Time-to-Digital Converter (TDC) representing a measured ratio of a reference clock (Tref) period to a synthesizer clock (Tdco) period;
   a second input to accept a digital message selecting a first ratio (Nf); and,
   an output to periodically supply a digital phase error (pherr) message proportional to an error in phase between the reference clock and the (synthesizer clock*Nf).

2. The frequency integrator of claim 1 wherein the first input accepts the tdcOUT message at a rate equal to the reference clock frequency; and,
   wherein the output supplies the pherr message at a rate equal to the reference clock frequency.

3. The frequency integrator of claim 1 further comprising:
   a divider to accept the tdcOUT messages and to supply divided tdcOUT (1/tdcOUT) messages;
   a summing module having inputs to accept the divided tdcOUT messages, the first ratio Nf, and a previous pherr message (pherr[k−1]), the summing module adding pherr[k−1] to the divided tdcOUT message and subtracting Nf to supply a current period pherr message (pherr [k]); and,
   a delay having an input to accept the current pherr message and an output to supply the previous pherr message in a subsequent time period.

4. The frequency integrator of claim 1 wherein the frequency integrator calculates a period difference (err) value as follows:

$err[k]=Tdiv+err[k-1]-Tref;$ where Tdiv is the period of (synthesizer clock*Nf);
   where k is a time sequence value.

5. The frequency integrator of claim 4 wherein the frequency integrator refines the calculation of the err value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

where out[k]=Tref/Tdco.

6. The frequency integrator of claim 5 wherein the output supplies the pherr message as follows:

$pherr[k]=err[k]/Tref;$ $pherr[k]=Nf/out[k]+pherr[k-1]-1;$ $pherr[k]=Nf(1/out[k])+pherr[k-1]/Nf-Nf.$ 7. A digital phase-locked loop (PLL) comprising:
   a successive time-to-digital converter (STDC) having an input to accept a reference clock, an input to accept a synthesizer clock from a frequency synthesizer, and an output to periodically supply a digital tdcOUT message representing a measured ratio of the reference clock (Tref) period to the synthesizer clock (Tdco) period;
   a frequency integrator having a first input to accept the tdcOUT messages, a second input to accept a digital message selecting a first ratio (Nf), and an output to periodically supply a digital phase error (pherr) message proportional to an error in phase between reference Clock and the (synthesizer clock*Nf);

a digital loop filter having an input to accept the pherr message and an output to periodically supply a digital control message; and, a digitally controlled oscillator having an input to accept the control messages and an output to supply the synthesizer clock in response to the control messages.

8. The digital PLL of claim 7 wherein the STDC supplies the tdcOUT message at a rate equal to the reference clock frequency; and, wherein the frequency integrator supplies the pherr message at a rate equal to the reference clock frequency.

9. The digital PLL of claim 7 wherein the frequency integrator calculates a period difference (err) value as follows:

$$err[k]=Tdiv+err[k-1]-Tref;$$

where Tdiv is the period of (synthesizer clock*Nf); and, where k is a time sequence value.

10. The digital PLL of claim 9 wherein the frequency integrator refines the calculation of the err value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

where out[k]=Tref/Tdco.

11. The digital PLL of claim 10 wherein the frequency integrator supplies the pherr message as follows:

$$pherr[k]=err[k]/Tref;$$

$$pherr[k]=Nf/out[k]+pherr[k-1]-1;$$

$$pherr[k]=Nf(1/out[k])+pherr[k-1]/Nf-Nf.$$

12. The digital PLL of claim 7 wherein the frequency integrator includes:

a divider to accept the tdcOUT messages and to supply divided tdcOUT (1/tdcOUT) messages;

a summing module having inputs to accept the divided tdcOUT messages, the first ratio Nf, and a previous pherr message (pherr[k−1]), the summing module adding pherr[k−1] to the divided tdcOUT message and subtracting Nf to supply a current period pherr message (pherr[k]); and, a delay having an input to accept the current pherr message and an output to supply the previous pherr message in a subsequent time period.

13. The digital PLL of claim 7 wherein the STDC includes:

a frequency detector having inputs to accept the reference and synthesizer clocks, and an output to supply a count of the number of synthesizer clock cycles per reference clock cycle;

a first TDC having an input to accept the reference clock, and input to accept the synthesizer clock, the first TDC measuring a first difference between an edge of a reference clock period and a corresponding edge of a synthesizer clock period, providing the first difference measurement at an output, and providing the synthesizer clock delayed a full cycle;

a phase interpolator having an input to accept the reference clock, an input to accept the synthesizer clock, and an input to accept the first difference measurement, the phase interpolator supplying the reference clock delayed to create a second difference between the edge of the delayed reference clock period and the corresponding edge of the synthesizer clock period, where the second difference is less than the first difference;

a second TDC having an input to accept the delayed reference clock period, and input to accept the delayed synthesizer clock, the second TDC measuring a third difference between the edge of the delayed reference clock period and the corresponding edge of the delayed synthesizer clock period, and providing the third difference measurement as a time duration; and, a digital signal processor (DSP) having an input to accept the third difference measurement, an input to accept the first difference measurement, an input to accept the count from the frequency detector, and an output to supply the tdcOUT message.

14. In a digital phase-locked loop (PLL), a method for deriving a digital phase error signal, the method comprising:

a digital frequency integrator periodically accepting a digital tdcOUT message from a Time-to-Digital Converter (TDC) representing a measured ratio of a reference clock (Tref) period to a synthesizer clock (Tdco) period;

accepting a digital message selecting a first ratio (Nf); and, periodically supplying a digital phase error (pherr) message proportional to an error in phase between the reference clock and the (synthesizer clock*Nf).

* * * * *